United States Patent [19]
Nelson et al.

[11] Patent Number: 5,354,982
[45] Date of Patent: Oct. 11, 1994

[54] IMAGING SYSTEM HAVING OPTIMIZED ELECTRODE GEOMETRY AND PROCESSING

[75] Inventors: Owen L. Nelson, St. Paul; John E. Potts, Woodbury, both of Minn.

[73] Assignee: Minnesota Mining and Manufacturing Company, St. Paul, Minn.

[21] Appl. No.: 163,266

[22] Filed: Dec. 6, 1993

Related U.S. Application Data

[60] Division of Ser. No. 998,260, Dec. 31, 1992, Pat. No. 5,268,569, which is a continuation of Ser. No. 918,433, Jul. 22, 1992.

[51] Int. Cl.$^5$ .............................. H01J 40/14
[52] U.S. Cl. ................. 250/214 LA; 250/370.09
[58] Field of Search ............. 250/214 LA, 315.3, 326, 250/370.09; 313/531

[56] References Cited

U.S. PATENT DOCUMENTS

| | | | |
|---|---|---|---|
| 3,976,484 | 8/1976 | Ando et al. | 250/315.3 |
| 4,085,327 | 4/1978 | Swank et al. | 250/370 |
| 4,818,857 | 4/1989 | Micheron et al. | 250/214 LA |

*Primary Examiner*—David C. Nelms
*Assistant Examiner*—K. Shami
*Attorney, Agent, or Firm*—Gary L. Griswold; Walter N. Kirn; William D. Bauer

[57] ABSTRACT

An imaging system employs a photoconductive material capable of bearing a latent photostatic image, a plurality of elongated parallel stripes adjacent the photoconductive material, selective scanning of the stripes to produce charge carriers within the photoconductive material, and time-ordered detection of the current created by the charge carriers with the plurality of elongated parallel stripes. Appropriate addressing of the stripes as they are scanned produces a pixellated representation of the latent image. The system has improved output signal strength and higher resolution than known systems.

20 Claims, 6 Drawing Sheets

IMAGING SYSTEM HAVING OPTIMIZED ELECTRODE GEOMETRY AND PROCESSING

This application is a divisional application of co-pending U.S. patent application No. 07/998,260 filed Dec. 31, 1992, U.S. Pat. No. 5,268,569 which is a continuation of U.S. patent application No. 07/918,433 filed Jul. 22, 1992.

TECHNICAL FIELD

This invention relates to systems for producing images, and especially those systems which use photoconductive materials to absorb radiation to create a latent image, followed by a selective detection of the latent image in the photoconductive material.

BACKGROUND

One type of imaging system employs photoconductive materials to absorb incident radiation representative of an image of an object. Suitable photoconductive materials will absorb the radiation and produce electron-hole pairs (charge carriers) which may be separated from each other by an electric field applied across the photoconductor, creating a latent image at the surface of the photoconductor (which is typically a thin planar layer). A narrow beam of scanning radiation substantially completes discharge of the photoconductor, by creating motion of a second set of charge carriers. The distribution of these second charge carriers in the plane of the photoconductor is affected by the distribution of the first charge carriers, i.e., by the latent image. The motion of the second charge carriers is detected and digitized in an appropriate circuit, and thus the latent image is captured in digital form.

In one specific embodiment, the photoconductor is part of a multilayer structure comprising two electrodes, between which are the photoconductive layer and an insulating layer. A high voltage power supply maintains electric fields in the structure during exposures to the incident radiation and the scanning radiation (although not necessarily the same field strength is present during each exposure). An example of this type of system is taught in U.S. Pat. No. 4,176,275 (Korn et al.). Application of the electric field across the photoconductive layer can be assisted by establishing a prior (reverse) field across the insulating layer, as taught in U.S. Pat. No. 4,539,591 (Zermeno et al.).

A second and closely related approach, known as the air-gap photo-induced discharge (PID) method, employs air as the insulating layer, and requires that a uniform separation be maintained between the two electrodes, typically by high-precision mechanical or piezoelectric devices. A corona charges the surface of the photoconductor prior to exposure to radiation, producing an electric field in the material. Thus, the incident radiation partially discharges the surface to produce a latent image, and the read-out signal is induced by the charge motion under the influence of the residual electric field in response to the scanning radiation. Such a system is described in Rowlands et al., Med. Phys. 18(3), May/Jun 1991 at 421–431.

Various methods for scanning the latent image exist. For example, the method of U.S. Pat. No. 4,961,209 (Rowlands et al.) employs a transparent sensor electrode positioned over the photoconductive layer, and a pulsed laser which scans the photoconductive layer through the transparent sensor electrode. By moving the photoconductive layer and the transparent sensor relative to each other, so that the direction of relative motion is transverse to the direction in which the laser scans, a pixel-by-pixel discharge of the charge carriers is created.

Practical applications of these systems have encountered several problems.

First, fabrication of the imaging stack (i.e., the electrodes, insulator, photoconductive material, etc.) requires applying layers of material to each other, typically by constructing two sub-stacks, and then applying them to each other. These procedures can introduce non-uniformities into the thicknesses of the imaging stack.

Second, reflection and scattering of incident radiation can occur at the interfaces between layers, reducing image quality. This problem, and the attempted solutions to it, are compounded by the non-uniformities in thicknesses.

Third, discharge breakdown of the insulative material is possible, especially in the air-gap PID approach, leading to avalanche currents in the system.

Fourth, as the areal size of the imaging stack increases, a requirement of practical applications such as chest x-ray imaging, the capacitance created by the electrode plates increases, reducing the effectiveness of the system. One approach to this last problem is that of U.S. Pat. No. 4,857,723 (Modisette). This approach avoids, rather than solves, the capacitance issue, by employing many small detectors ganged together.

DISCLOSURE OF THE INVENTION

The invention is a system for producing an image of radiation incident upon an imaging device. The imaging device comprises a first conductive layer, an insulative material, a photoconductive insulative layer, an electrically blocking layer, and a second conductive layer (comprising a segmented array of conductive electrodes), in that order. The system further includes means for creating an electric field between the first and second conductive layers such that electron-hole pairs are created by the absorption of incident radiation, then separated to create a current, resulting in the formation of a latent electrostatic image at the interface between the insulative material and the photoconductive insulative layers. The invention includes a scanner which, in a first time-ordered pattern, energizes a single spot of the imaging device at a time, each spot producing a second current, comprising mobile charge carriers, within the imaging device. Finally, the system further includes detection electronics attached to the conductive electrodes and sensitive to motion of the charge carriers, and the sensitivity of the electronics is timed to the members of the array in a second time-ordered pattern. To complete the invention, the array of electrodes is a plurality of elongated parallel stripes, each stripe lying in a first direction, the scanner scans the array, one member at a time, in a second direction substantially different from the first direction, and the detection electronics interprets a coincidence of the first and second patterns as a pixel of the image. Thus, a pixel representation of the image is produced. The system has improved output signal strength and higher resolution than known systems.

DETAILED DESCRIPTION

Figure 1:
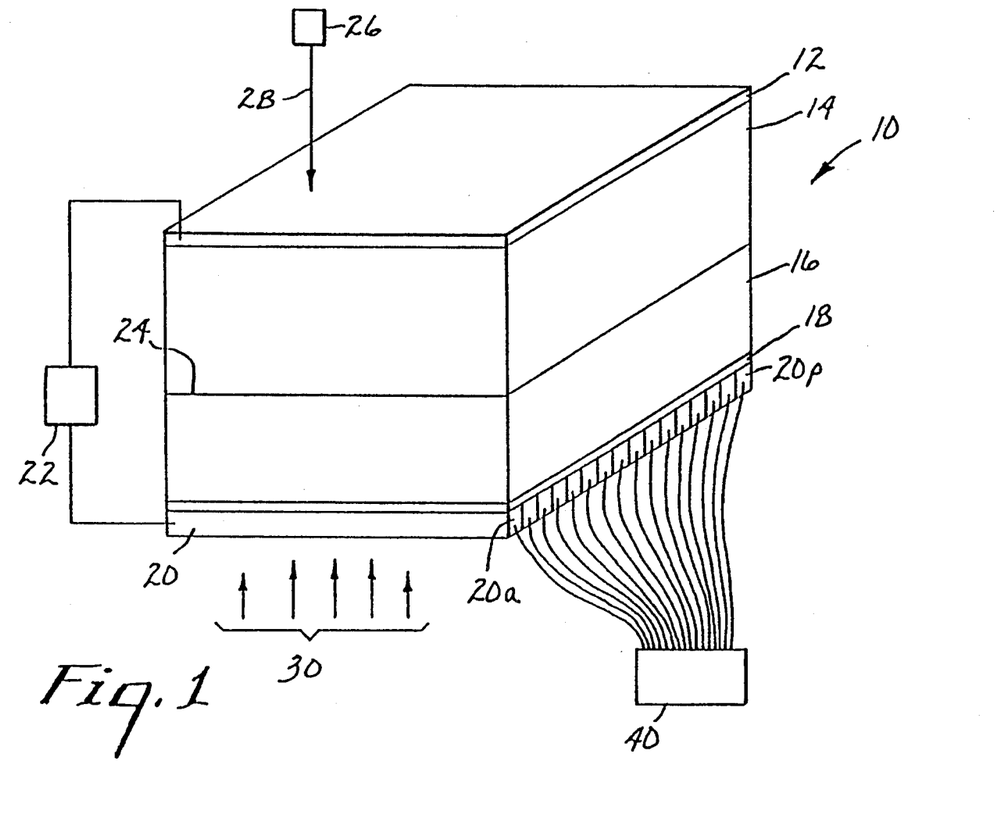
FIG. 1 is a schematic representation of one embodiment of the invention.

The basic construction of the invention is illustrated schematically in FIG. 1. The imaging device 10 comprises a layered stack: a first conductive layer 12, an insulative material 14, a photoconductive insulative layer 16, an electrically blocking layer 18, and a second conductive layer 20, in that order (top to bottom as shown). The second conductive layer 20 comprises a segmented array of conductive electrodes, 20a–20p in the sixteen channel embodiment shown (other numbers of channels are possible).

Although not shown for clarity, in an actual construction a support for the layered stack, such as a supporting transparent substrate and/or a mechanical frame of some type, would generally be used. The layered stack may be built up on the substrate from individual components, and then placed in the frame. However, with a suitable choice of materials, the layered stack may not require a substrate or a mechanical frame, and thus the invention is not so limited as to require their use.

Many materials are suitable for each of the layers of the stack, subject to considerations of electrical properties and transparency discussed below. Generally, the substrate, if used, may be any material providing mechanical support, dimensional stability, and low electrical conductivity. For example, glass having a thickness of approximately 2 to 4 mm is a suitable substrate upon which the segmented array of the second conductive layer may be created by depositing a planar conductive sheet and then etching away undesired material.

The preferred material for the photoconductive insulative layer is amorphous selenium, which may be incorporated into the layered stack in a conventional manner. Lead oxide, cadmium sulfide, and mercurous iodide, among other materials, are suitable, as are organic photoconductors. In general, the photoconductive insulative layer will have low conductivity in the absence of radiation so that an electric field may be maintained across it for a sufficient period of time, such as a resistivity of about $10^9$ ohm-cm or greater.

The thickness of the photoconductive insulative layer should be sufficient to allow it to absorb about 50% or more of the flux of incident radiation (described below). For amorphous selenium and diagnostic x-ray radiation, for example, this thickness is approximately 250-550 micrometers.

The insulative material may be a fluid material (including a gaseous material such as air) at the operating temperature of the system, or a layer of material which is non-fluid at the operating temperature of the system.

The insulating layer is typically 100 to 300 microns thick. It may be created through the use of vapor-deposited polymeric materials such as poly-p-xylene or Union Carbide "Parylene-C," a technique that is preferred for its ability to create a uniformly thick layer, although this ability is adversely affected somewhat when the material is deposited from a point source. Alternatively, the first conductive layer may be separately deposited upon a flexible insulative material, such as an gold layer evaporated onto a polymeric film, and that product added to the stack by use of an optical adhesive, typically in a layer of 1 to 30 microns thick.

Voltage source 22 creates an electric field between the first and second conductive layers 12 and 20, such that electron-hole pairs created in the photoconductive insulative layer (see below) are separated in the imaging device 10 by first incident radiation 30. An electric field of 5–20 V/micron is typical. Field strengths in the higher end of this range improve the carrier separation efficiency of the system. Generally, but not necessarily, when amorphous selenium is used, the electrically blocking layer is chosen such that positive polarity exists on the electrode nearest the insulative layer, and the same relative polarity is used in all phases of the operation of the system, but this is also not necessary if appropriate adjustments are made. For example, the first electrode may be biased negatively with respect to the second electrode while the photoconductive layer is exposed to uniform radiation, thereby creating a uniform charge density at the interface between the photoconductive and insulating layers. Thus the electric field across the insulator is much higher than that across the photoconductive layer. During the exposure to incident radiation, the voltage source is adjusted so that the voltage across the insulating layer is shared with the photoconductor, e.g., by using a voltage source value of zero.

The incident radiation leaves a latent image in the imaging stack by creating charge carriers within the photoconductive insulative layer 16. The charge carriers separate under the influence of the electric field created by the voltage source 22. This creates a first current within the imaging device 10, reducing the field in an image-wise pattern, resulting in the formation of a latent electrostatic image at the interface 24 between the insulative material 14 and the photoconductive insulative layer 16. To keep the latent image from dissipating, a field of approximately 1–5 V/micron may be left across the structure by disconnecting the voltage source 22 and relying on the relatively slow dark decay rate of the photoconductive insulative layer to maintain the field, or by using another voltage source (not shown) at that field strength, and holding it constant.

The image of interest is in the form of a pattern of incident radiation 30, which is incident upon the imaging stack from either side. In FIG. 1, the incident radiation 30 is incident from the direction of the array of electrodes, but this is illustrative only. In this embodiment, the array of electrodes and the electrically blocking layer 18 must be semitransparent at the wavelength of the incident radiation 30. A preferred embodiment of the invention is designed for use with incident radiation in the form of x-rays (wavelength $10^{-7}$ to $10^{-10}$ cm), for which thin metallic (e.g., aluminum) layers are sufficiently semitransparent.

In the readout phase of operation, a third electric field strength is maintained across the layered stack, typically 1–5 V/micron, and optionally of reverse polarity from that used during the exposure to the image. Scanner 26, in a first time-ordered pattern, utilizes scanning radiation 28 to energize the imaging device 10 to produce a second current, comprising mobile charge carriers, within the imaging device 10.

Scanning radiation 28 may have a wavelength substantially similar to that of the incident radiation, or a substantially different wavelength. Scanning radiation 28 may be ultraviolet, visible, or infrared radiation.

Generally, the first time-ordered pattern will ensure that the entire surface of the layered stack holding the latent image is scanned; a preferred pattern scans the entire surface of the layered stack, since until the scan is performed the location of the image on the surface is not known. For most efficient operation at highest resolution, any point on the surface is scanned only once, and no points are missed. A preferred pattern is a series of parallel lines in which the scanning proceeds in the same direction in each line, allowing time for the scan to return to the other side of the stack between lines. Such a pattern can be oriented at angles up to 45° to the direction of the electrodes, but preferably is oriented perpendicular to the direction of the electrodes.

Scanning radiation 28 is absorbed in the photoconductive insulative layer 16. Generally, the scanner is a continuous laser and the scanning radiation is in the visible wavelength range. The wavelength is determined by the energy required to excite charge carriers in the photoconductive layer. For an amorphous selenium photoconductive insulative layer, a blue-green laser is appropriate.

A laser is preferred for its focusing and intensity properties, but is not preferred for its coherence. The use of a coherent light source with an insulating layer having a non-zero thickness can produce interference effects. These may be minimized by reducing the reflection of the scanning radiation from the surfaces of the insulating layer, such as through the use of antireflection coatings on one or both sides of the layer. Methods of accomplishing this have been taught in many sources, including U.S. Pat. No. 4,711,838 (Grezskowiak et al.).

Figure 2:
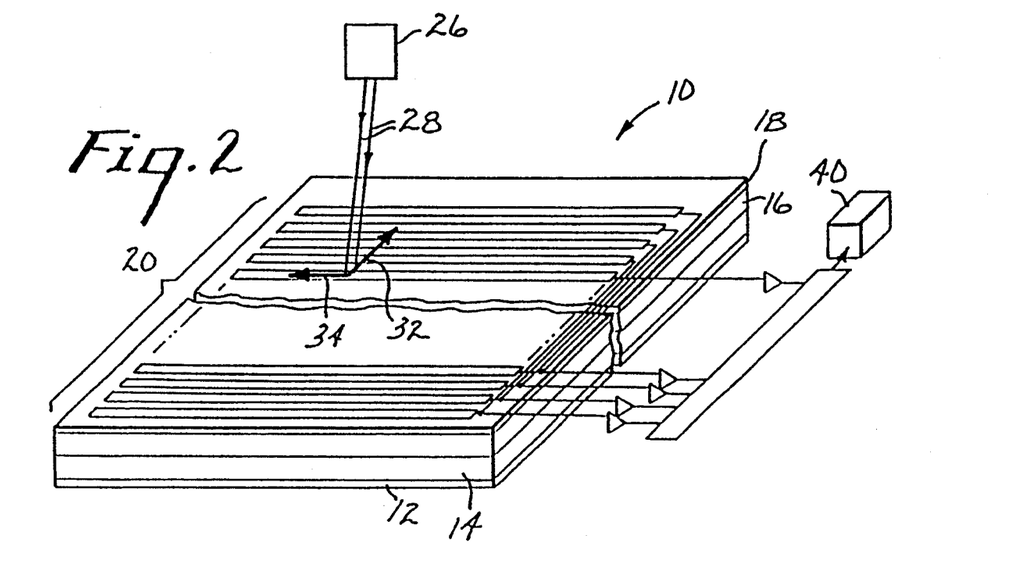
FIG. 2 is a schematic representation of another embodiment of the invention.

In the embodiment shown in FIG. 1, the scanning radiation 28 energizes the imaging stack 10 by passing through the first conductive layer 12 and the insulative layer 14 prior to absorption. This is illustrative only, as the scanning radiation 28 could also energize the imaging stack 10 by passing through the second conductive layer 20 and the electrically blocking layer 18 prior to absorption, as shown in FIG. 2. In either case, the conductive layer through which the scanning radiation passes must be semitransparent at the wavelength of the scanning radiation (e.g., the wavelengths on the order of several hundred nanometers that are typical of visible lasers). Generally, either conductive layer will be semitransparent due to a metallic construction at a small thickness (e.g, gold), or a non-metallic construction at a greater thickness (e.g., indium tin oxide 0.1 to 0.5 microns thick). The electrically blocking layer 18 must also be semitransparent and is typically 0.01 to 0.1 microns thick. The insulating layer 14 may be transparent due to its polymeric composition (e.g, polyester). Also, if a substrate is present and radiation passes through it, it must be transparent at the wavelengths involved.

As indicated in FIG. 2, the array of electrodes 20 is a plurality of elongated parallel stripes. In x-ray radiation applications, a stripe width of 10–200 microns is preferred. When the array is to act as if it were a single continuous conductive plate, the individual stripes are simply connected together in any convenient manner (not shown in FIG. 2).

The direction of the electrodes 20 must be substantially different from the direction of the scan performed by scanner 26, i.e., scanner 26 scans the array in a "vertical" direction, indicated by arrow 32, and the electrodes lie in a "horizontal" direction indicated by arrow 34. Thus, as shown, the directions 32 and 34 are perpendicular to each other, but other substantially different directions are possible with appropriate modifications to detection electronics 40.

The latent image is captured by detection electronics 40, which is attached to the conductive electrodes 20, and is sensitive to motion of the charge carriers set in motion by the scanning radiation 28. Approximately 10–50 microseconds may be required for the charge carriers to reach the electrodes. For each electrode, the change in induced charge is detected and amplified to produce a signal indicative of the capture of that part of the latent image.

The sensitivity of the detection electronics 40 is timed to the members of the array 20 in a second, time-ordered pattern. A single electrode is made more sensitive than adjacent electrodes by holding the adjacent electrodes at "effective" or "virtual" ground level (not necessarily absolute ground level) relative to the single electrode between them, and by triggering an integrator circuit to begin collecting charge on that electrode. For example, given the parallel lines of the first time-ordered pattern mentioned above, the second time-ordered pattern would follow the "direction" of sensitivity, i.e., the location of the most sensitive electrode as a function of time would appear to move repeatedly across the layered stack in the same direction as each pass of the scanning radiation. This apparent motion would be synchronized with the scanning pattern, including pauses at each end of the stack to allow the scanner to move to the next line.

Thus, by appropriate coordination of the first and second time-ordered patterns, the detection electronics 40 interprets a coincidence of the first and second patterns as a pixel of the image produced by incident radiation 30. This is contrary to the known practice of scanning a striped electrode in this type of system with a single line-shaped pattern, and coordinating the electronics to read all electrodes simultaneously in a parallel fashion, as taught in U.S. Pat. No. 4,176,275 (Korn et at.) at column 6 lines 18–36.

FIG. 2 shows an example of how the array of striped electrodes could be attached to the detection electronics 40, although other techniques are possible. For convenience of illustration, only nine electrodes are shown in FIG. 2: the first through fourth, inclusive; the Nth; and the N+1st to N+4th, inclusive. Beginning with the first electrode, every Nth next electrode stripe is electrically tied together, i.e., the first and the N+1st are tied together, as are the second and the N+2nd electrodes, the third and the N+3rd electrode, etc. Thus, N channels may be created from M electrodes, where M is greater than N, but only N circuits are required, although of course up to M circuits could be used.

Although not shown in FIG. 2 for clarity, the array of electrodes also contains a start-of-scan and an end-of-scan electrode at opposite ends of the array, each of which may have a dedicated circuit if desired. This allows the electronics to identify positively if the scanning radiation is at either of these positions in the array, and thus synchronize the detection circuitry for each scanned line.

Figure 3:
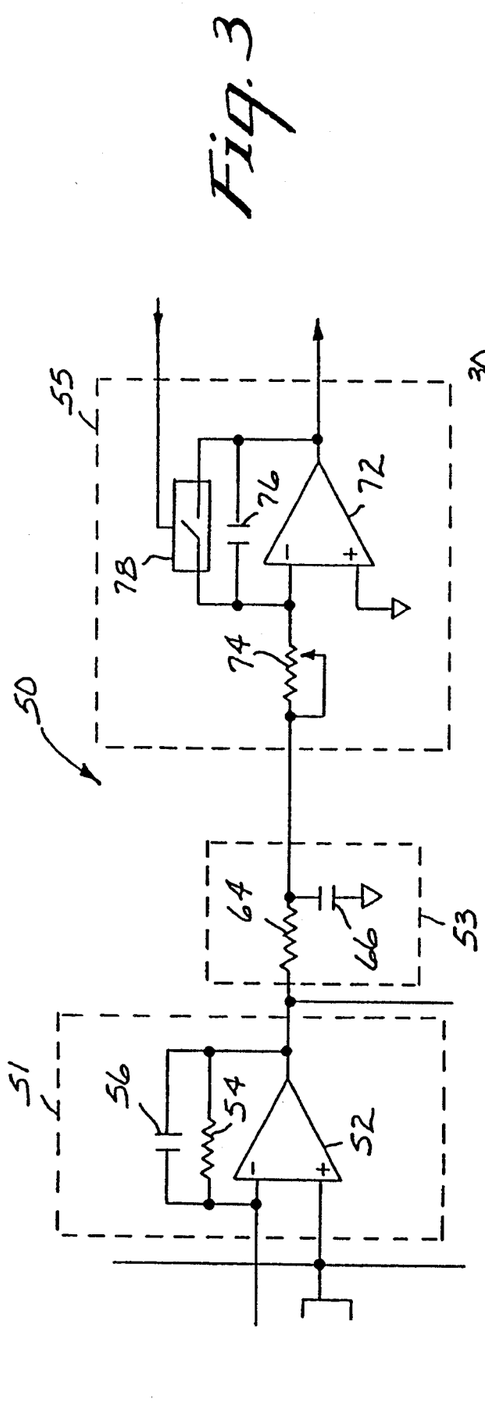
FIG. 3 is an electrical schematic diagram of a preferred amplifier for use with the invention.

FIG. 3 shows an electrical diagram of the preferred circuit 50 for each of the N channels. The circuit 50 is comprised of three combinations 51, 53, and 55 of circuit elements. The first combination 51 includes an operational amplifier 52, which can be Burr-Brown OPA637, and a feedback resistor 54, which can be $1 \times 10^7$ ohms, connected in parallel with a compensation capacitor 56, which can be 70 femtofarads. This combination of circuit elements serves as a transimpedance amplifier which results in a conversion of charge pulses into a corresponding voltage pulse.

The second combination 53 of circuit elements acts as a low-pass filter and includes a resistor 64 and a capacitor 66. This low-pass filter should be designed so that the response rolls off at a desired frequency. This combination of elements need not be included in the circuit 50.

The third combination 55 of circuit elements includes an operational amplifier 72, such as Burr-Brown OPA627, a capacitor 76, such as 0.001 microfarad, a variable input resistor 74, having a resistance of 0–20 kilo-ohms, and a remotely-controlled switch 78, such as Siliconix VN0300M N-channel enhancement FET. This combination of circuit elements functions as a switched integrator controlled by an external signal. The resistor 74 is adjusted to give the desired integrator response in volts per coulomb. The voltage output of the integrator can be sampled by an analog multiplexer that is controlled by an external signal.

Conventional timing circuitry may then be employed by detection electronics 40 (shown in FIG. 2) to process the N-channel input signal into M lines of vertical resolution. In the horizontal direction, the resolution is determined by the displacement of the path of scanning radiation 28, which is easily controlled by the scanner 26. In a preferred embodiment N=32 and the spacing between electrode center lines is 170 microns (about 5.9 electrodes per millimeter). The lateral displacement of the scanning radiation should then be about 5.9 lines/mm to produce about 34.6 of the preferred square pixels per square millimeter of image.

Preferably, each electrode has a width equal to 10–90% of the spacing between electrode center lines, and 50–80% is most preferred. Values above this range lead to increased capacitance between electrodes, and values below this range tend to increase electrode resistance and difficulty in fabrication.

Surprisingly, there is essentially no loss of available charge collected by each electrode even though the electrodes do not cover the entire surface area of the layered stack. This is because lateral migration of the charge carriers created in the areas between the electrodes, under the influence of the applied electric field, allows the entire image to be recovered, despite the use of segmented electrodes.

Figure 4:
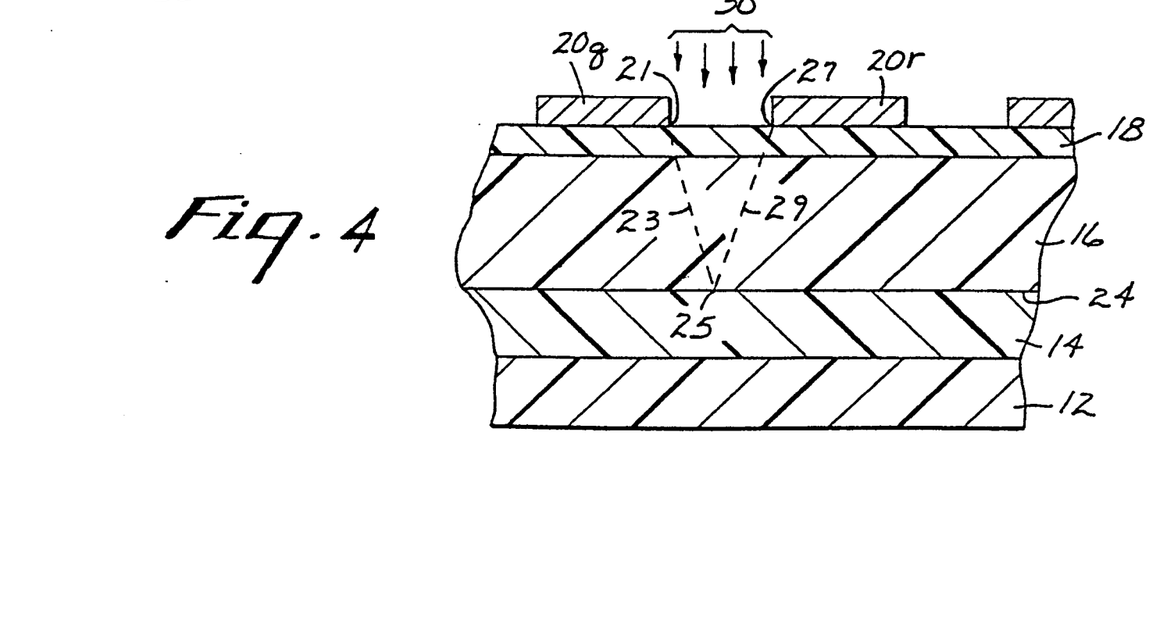
FIG. 4 is a cross-section of a portion of the embodiment of FIG. 2.

FIG. 4 shows a cross-section of a portion of the system shown in FIG. 1. Electrodes 20q and 20r are representative members of the array of electrodes forming the second conductive layer 20. There is a gap between electrodes 20q and 20r, and thus it appears that a portion of the image 30 would not be captured by the system. However, charge carriers collected at the edge of electrode 20q, designated as point 21, may have migrated along path 23 from the interface 24, originating in the vicinity of point 25. Similarly, charge carriers collected at the edge of electrode 20r, designated as point 27, may have migrated along path 29 from the vicinity of point 25. Thus, charge carriers are collected from the entire extent of interface 24, and all charge carriers created at the interface 24 are collected by electrodes 20q and 20r. A similar result occurs for all pairs of electrodes in the array.

Of course, the applied field strength, the thickness of the photoconductive insulative layer, and the spacing between electrodes, must all be chosen such that the trajectories and velocities (toward the first conductive layer as well as transverse to that direction) of the charge carriers are optimized for complete recovery of the charge carriers at the interface.

It is possible, although not as preferred, for a single electrode to support multiple lines of resolution, thus more than one pixel of the electrostatic image in the vertical direction will be produced by a single stripe of the array. This can be accomplished by using multiple scans of an intensity-modulated laser spot having a size smaller than the width of a stripe, and scanning at higher rates than the preferred embodiment. Each scan will involve modulation of the intensity of the smaller spot over a different subportion of the stripe.

Also, the first and second time-ordered sequences may be resynchronized periodically (e.g., at least once per scan) during each scanned line.

The scanned image may be processed in many ways. Typically, after scanning, the electronics processes the image signal through analog/digital circuitry. Each pixel of image is represented as a (preferably at least 12-bit) number indicating the intensity of the image. A single line of the image may be handled as a single block of data. If not done so already, interference effects due to a non-zero thickness insulating layer and a coherent light source should be removed from the image, preferably through digital image enhancement techniques. Preferably, a "windowing" technique produces an 8-bit value from the 12-bit value to enhance the contrast of the image prior to display on a monitor or hard copy device.

The use of a scanned point beam of light and the collection of induced current using segmented, narrow electrodes located adjacent to the photoconductive insulative layer, provides several independent advantages over known systems.

First, as compared to the case in which the signal is collected at an electrode located adjacent the insulative layer, the invention offers greatly improved image resolution. This advantage results from the location of the segmented electrode, rather than the segmentation per se. For example, with a selenium layer 350 microns thick, a polycarbonate insulator 175 microns thick, and using striped electrodes on 100 micron centers, when the stripes are adjacent the photoconductor they can resolve a latent image pattern with 5 cycles/mm modulation with 50% contrast. If the stripes were adjacent the insulator, they can show 50% contrast only for patterns of less than 1 cycle/min.

Second, segmentation of the electrodes allows for use of a plurality of amplifiers to detect portions of the image from different portions of the imaging stack, which in turn allows for the entire image to be formed in less time. Using multiple amplifiers, a single amplifier can wait for all the charges present on the associated electrode to reach a single electrode while the scanning radiation continues on to another region of the image.

While Korn et al. teach increased imaging rates, they use a line (rather than point) source of incident radiation, requiring that each stripe of the segmented array have a dedicated amplifier, and that all such amplifiers are active simultaneously. Use of a point source of scanning radiation permits several stripes to be connected together on a single amplifier, and does not require that all amplifiers operate identically in time.

Third, as compared to signals obtained from a given pixel located above a wider electrode, the narrow striped electrode provides a 10% to 80% increase in strength of the measured signal. This is the opposite of the prior art belief that faster image collection rates exact some degree of loss of signal detection efficiency.

Fourth, each amplifier is loaded by the capacitance of only M/N stripes rather than the capacitance of the entire imaging stack. Because amplifier noise increases with the size of the input capacitance, segmentation of the electrode reduces the magnitude of electronic noise associated with each amplifier.

Each of these advantages standing alone would result from the invention, but the combination of all of them together is a significant advantage of the invention over the prior art.

EXAMPLE 1

A detector was constructed as described above and shown in the Figures. The first electrode was made by depositing multiple groups of unconnected parallel stripes at center line distances of 170 microns on a glass substrate. Additional depositions near the ends of the stripes provided for the connection of every thirty-second stripe to a bus electrode which terminated at an edge connector pad, allowing connection of each stripe to one of a set of thirty-two amplifier circuits. Start-of-scan (SOS) and end-of-scan (EOS) stripes were added and connected to pads. An oxide blocking layer was then formed over the stripes, followed by a layer of amorphous selenium about 400 microns in thickness. A layer of insulating material, 175 micron thick polycarbonate, was then applied to the selenium layer using an optical adhesive. The insulating layer had a film of transparent conductive material on the outside surface of the polycarbonate to provide a second electrode. This detector was mounted in a holder which provided electrical connections and light control to protect the latent image.

Electronics were connected to the sample holder to provide a controlled high voltage of 3000 V to the second electrode, and also thirty-two amplifier circuits, each of which included a current-to-voltage gain stage and a gated integrator stage. Digital control circuits provided timed signals for gating the integrator stages and connecting each integrator in sequence to an analog-to-digital converter circuit. Additional circuitry provided SOS and EOS signals and timing circuits to synchronize the integrator gating sequence to the position of the laser spot as it scanned across the detector in a direction perpendicular to the stripes.

The scanning spot was formed by optics to an essentially gaussian 40 microwatt intensity profile of 100 micron width from a gated 442 nanometer helium-cadmium laser source, scanned with a rotating hologon element at a velocity of 29 meters/second at the detector plane. The detector was translated perpendicularly to the scan direction by a motor-driven stage moving at a velocity such that successive scans were spaced at 170 micron separations.

Control circuitry synchronized application of the readout voltage to the second electrode, stage motion, and scan rotation with the data collection signals to activate the amplifier integrator gates and collect digital pixel values from the analog-to-digital converters.

Figure 5:
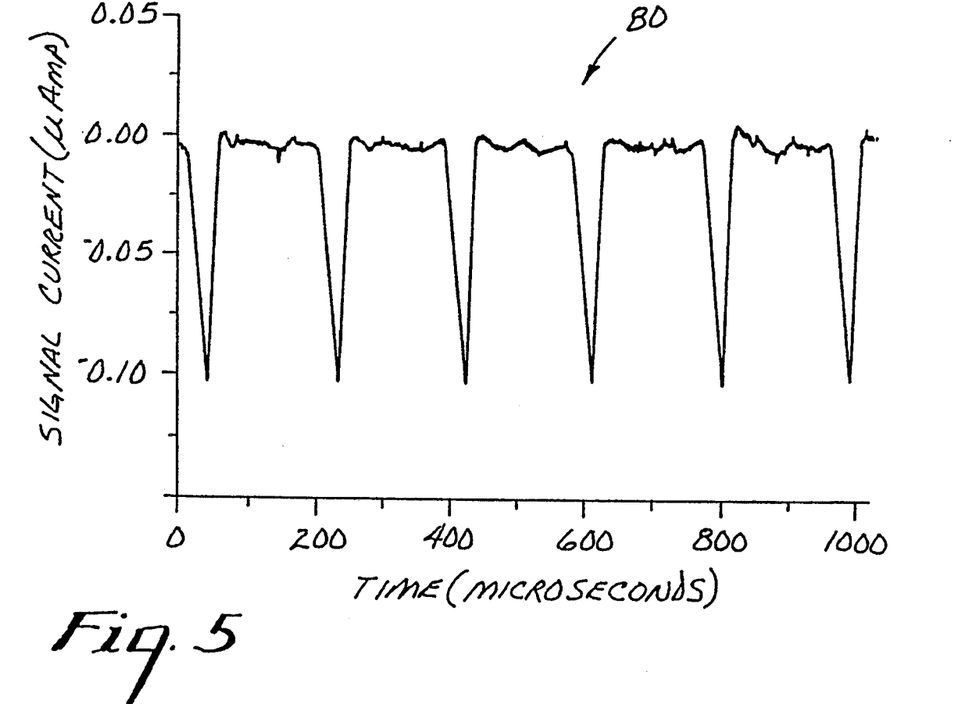
FIG. 5 is a trace of an electronic signal for an amplifier circuit in accordance with the invention.

A trace of a signal taken from the current-to-voltage stage of the eleventh amplifier circuit is shown in a graph 80 in FIG. 5. The graph 80 shows the current pulses from charge released by the laser light as it crossed stripes 11, 43, 75, 107, etc. The pulses are separated by 190 microseconds as determined by the scan velocity, and are each 60 microseconds wide reflecting the transit time of carriers through the selenium. These pulses were integrated to define the pixel signal array. A signal trace from the twelfth amplifier circuit showed essentially similar shape except it was shifted by a 6 microsecond delay needed for the light scan to move 1 stripe.

A plate designated as 79J, constructed as described above, was then used to capture an x-ray image. It was inserted in a holder under an x-ray source, with objects to be imaged interlaid. A voltage of 6 kV was applied to the second electrode with respect to the stripes, and the x-ray source was triggered. The voltage was then reduced to 1 kV and the Plate was inserted into the readout apparatus where the stripes were connected to their respective amplifier circuits. A readout voltage of 3 kV was applied to the second electrode and the plate was scanned. The digital signal corresponding to each pixel was collected and converted to an array suitable for presentation on a display monitor. An image of the objects was clearly visible.

Another plate of similar construction, designated 79O, was used to capture an X-ray image. A reverse voltage, −4 kilovolts, was applied to the second electrode while the plate was exposed to uniform room illumination. The voltage was then disconnected and the illumination removed. After a few seconds in the dark, the first and second electrodes were connected, placing approximately 2 kilovolts across the photoconductor layer, and the plate was exposed to an X-ray pattern.

A readout voltage of zero volts was connected to the second electrode and the plate scanned with a laser spot of 10 microwatts power moving across a pixel stripe in 6 microseconds. Current pulses of shape and magnitude very similar to those in FIG. 5 were observed, and the image was clearly visible.

EXAMPLE 2

A detector was constructed to provide comparative data with respect to other constructions. A glass plate substrate was pre-coated with a thin bonding layer of chromium and then vacuum-coated with a layer of aluminum to a thickness of about 0.6 microns. A pattern of striped electrodes was created using conventional photoresist and etching techniques. The pattern comprised several sets of stripes of differing width and spacing, each electrode being electrically accessible from the perimeter of the substrate. A thin layer of aluminum oxide was formed on the aluminum electrodes, and a layer of amorphous selenium was deposited to a thickness of 300 microns.

Separately, a 175 micron thick sheet of polyester was prepared with a transparent conductive electrode of indium tin oxide (ITO) on one surface having a resistivity of 30 ohms/square. The untreated side of the polyester was then applied to the etched substrate with an optical adhesive. The sample was then mounted in a holder providing electrical connection and illumination control.

The stripes were connected to amplifiers, each amplifier being a multistage op-amp circuit having a current-to-voltage transimpedence amplifier for the first stage, a voltage gain and output driver for the second stage, and a gated integrator for the optional third stage. In this Example, integrators were not used, and the current signals were displayed on a multi-trace oscilloscope.

A voltage source was connected between the ITO layer and the ground reference, thus connecting the stripes and the ITO layer through the voltage source. Timing circuits controlled the intensity and position, over the ITO layer side of the sample, of a spot of light from an argon-ion laser of approximately 488 nm wavelength. The laser light spot was focused to approximately gaussian shape and a diameter of about 95 microns, positioned with a galvanometer and mirror, and modulated by an aperture and acoustic-optic element. The laser spot could be scanned in a direction essentially perpendicular to the stripe electrodes at speeds of 0–100 m/s, and modulated in intensity through a range of less than one percent to one-hundred percent of full power (22 microwatts) for intervals as short as 2 microseconds. The laser light position and intensity signals were also displayed on the oscilloscope.

The amplifiers of two adjacent stripes, each of 80 micron width, spaced 100 microns between center lines, were selected. The remaining stripes were grounded. A voltage was applied to the ITO electrode to create an electric field across the sample of 1.3–7.0 volts/micron. The light spot scanned across the stripes at speeds of 5–50 meters per second.

The current signals from the two stripes showed satisfactory time offset from each other, and the duration of the signals varied satisfactorily with the field across the selenium layer, as verified by carrier transit time calculations. This showed that the current from each stripe corresponded to the carriers which were released in the selenium layer adjacent the attached insulating layer in the area defined by the light spot width and stripe spacing.

Figure 6:
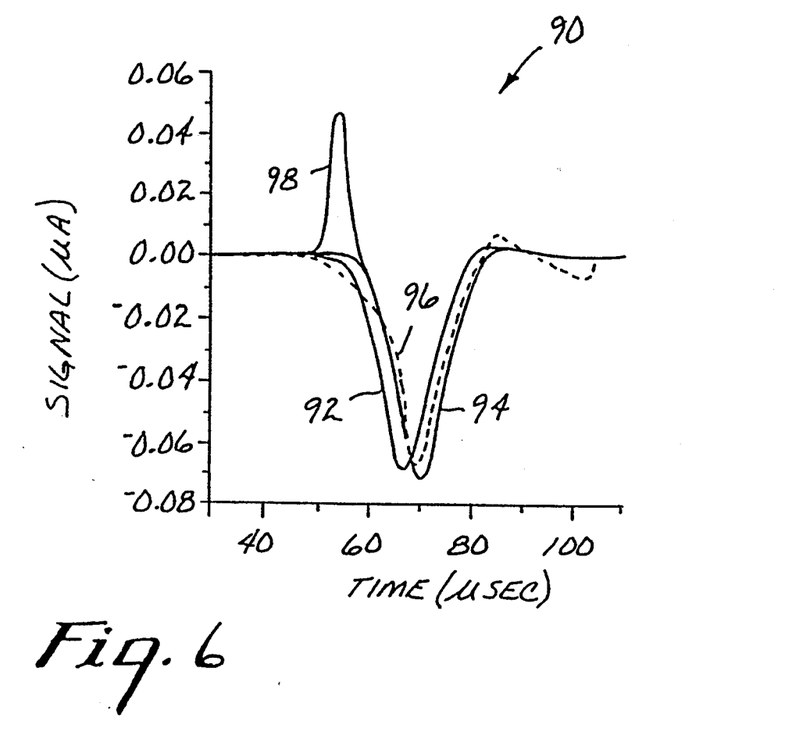
FIG. 6 is a graph of the performance of an embodiment of the invention.

A specific example of the signals from one scan with a spot velocity of 28 meters per second and an electric field in the selenium layer of 1.5 volts/micron is shown in the graph 90 in FIG. 6. The lines 92 and 94 represent the current as a function of time in microamps per microsecond for two adjacent stripes 80 microns wide, separated by 20 micron gaps. The line 98 represents the calculated light intensity falling on the second stripe from a 95 micron diameter spot with a stripe crossing time of 3.6 microseconds. The dotted line 96 represents the current predicted by an electrostatic model for carriers released by a gaussian scanned light spot and an initial (field-dependent) carrier transit time of 16 microseconds.

The data show well-defined current signals from each stripe even though the spot has crossed over several stripes during the transit of carriers over each stripe. The electric field directs the carriers through the photoconductive insulative layer with small lateral spread, and the resulting change in induced charge on the stripes as the carriers move creates the measured current. Also, surprisingly, the interaction of currents in adjacent stripes agreed with calculations based on electrostatic induced charge calculations, rather than the more applicable electrodynamic calculations.

EXAMPLE 3

Figure 7:
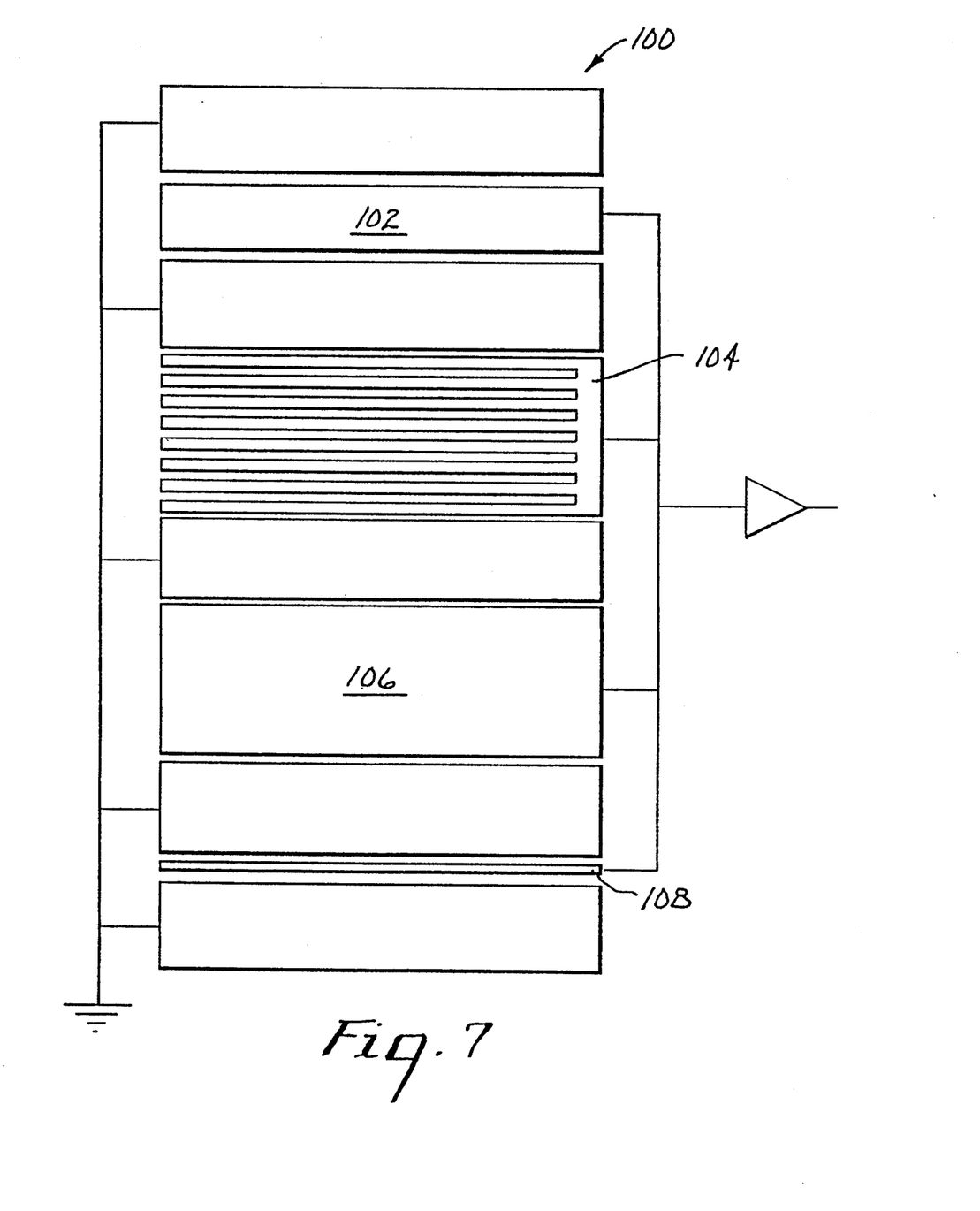
FIG. 7 is a schematic diagram of electrode stripes in accordance with the invention.

A detector was constructed according to these teachings, but consisting of only four interconnected electrode stripes, each surrounded by wide electrodes attached to an electrical ground as shown in FIG. 7. The detector 100 included an active electrode stripe 102 which was 380 microns wide, an active electrode stripe 106 which was 780 microns wide, and an active electrode stripe 108 which was 80 microns wide, as shown in FIG. 7. Each of the active electrode stripes 102, 106, and 108 were separated from their neighboring ground pads by gaps of 20 microns. The detector 100 also included a fourth active electrode stripe 104 which was comprised of eight interconnected 80 micron stripes, each separated from its neighbors by a gap of 20 microns, thereby forming, for the purposes of this example, another single 780 micron wide electrode separated from its adjacent ground pads by 20 microns on each side. This pattern was formed in thin (600 nanometer) aluminum on a glass plate. A blocking layer was then formed over the stripes, followed by a layer of amorphous selenium about 300 microns thick. A 175 micron thick polyester insulator layer was then attached to the amorphous selenium with an optical adhesive, and this layer was then coated with semi-transparent conductive indium-tin-oxide layer. The detector construction was then mounted in a holder that provided electrical connections and light control.

A positive high voltage was applied to the indium-tin-oxide electrode to create an initial electric field across the selenium layer of approximately 10 volts per micron and the detector was exposed to a flux of approximately 8 milliroentgens of X-ray radiation from a tungsten anode at an accelerating voltage of 70 kV peak. Half of the detector was protected by a heavy lead shield during this X-ray exposure.

For readout, electronics were connected to the sample holder to provide a controlled high voltage to the second (semitransparent) electrode sufficient to produce an electric field of about 5 V/micron in the selenium, and to provide for attachment of the interconnected electrodes to an amplifier circuit which includes a current-to-voltage stage and a gated integrator stage. Digital control circuits provided timed signals for gating the integrator stage, connecting the integrator to the analog-to-digital converter circuit and synchronizing the integrator gating sequence to the position of the laser spot as it scanned across the detector in a direction perpendicular to the stripes.

The scanning spot was formed by optics to an essentially gaussian intensity profile of 85 micron width from an argon-ion laser beam of wavelength 488 nanometers, translated past the stripes at a rate of approximately 1 meter/second by deflection by a galvanometer mirror, and modulated by an aperture and accousto-optic element. The detector was translated perpendicular to the scan direction by a motor-driven stage moving at a velocity that spaced successive scans at 85 micron separations. Control circuitry synchronized stage motion, laser gate opening and application of the readout voltage to the second electrode with data collection signals which were used to activate the amplifier integrator gate and collect digital pixel value values from the analog-to-digital convertor.

Figure 8:
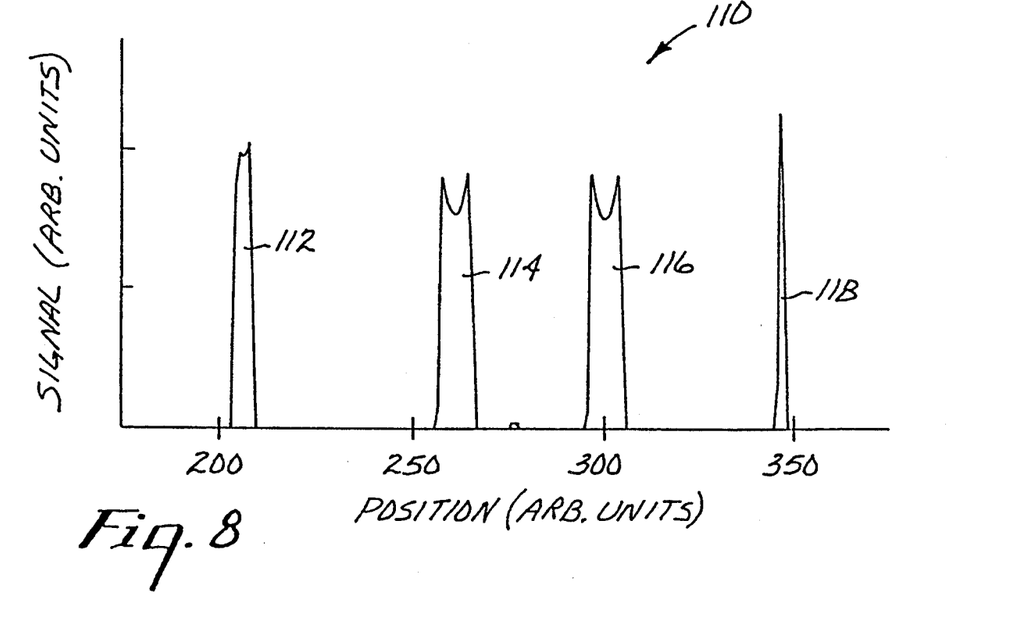
FIGS. 8 and 9 are graphs showing signal strength as a function of pixel number for a detector in accordance with the invention.
Figure 9:
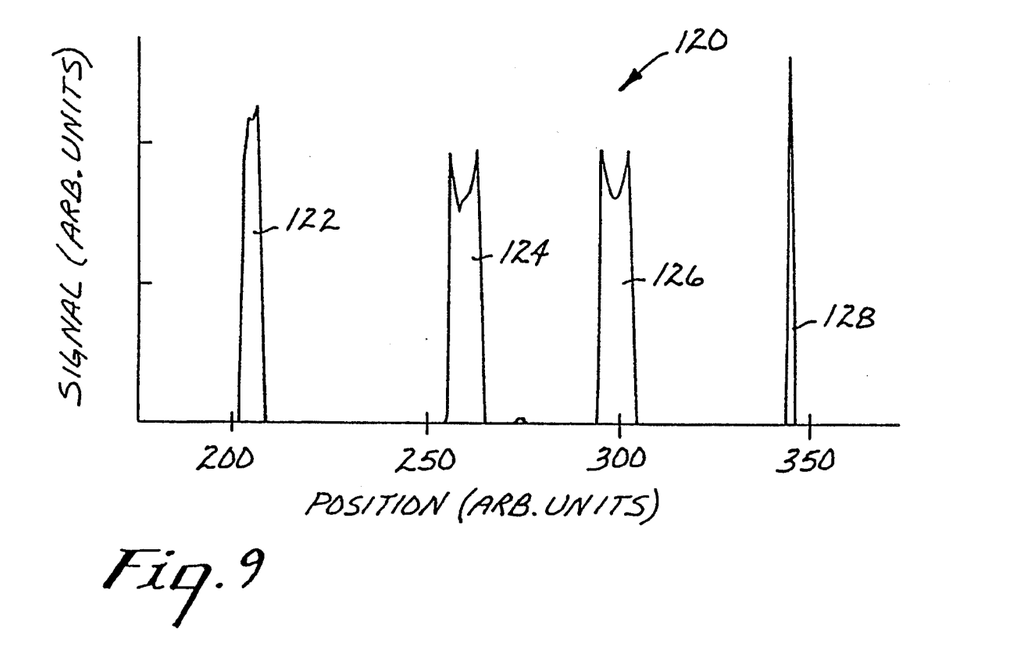

FIGS. 8 and 9 show the resulting signals as a function of position perpendicular to the stripes. Similar curves were generated by interconnecting adjacent stripes to form stripes of different widths. Graph 110 of FIG. 8 shows the signal strength for a region of the plate that was exposed to the X-ray flux. The signals for the electrode stripes 102, 104, 106, and 108 are represented by peaks 112, 114, 116, and 118, respectively. Graph 110 shows the enhancement of the signal as the laser passes over the edge of a stripe. The shape of peak 116 (corresponding to electrode stripe 106) indicates that the signal strength diminishes as the laser enters the central regions of the stripe.

The shape of peak 114 demonstrates that the segmented-but-interconnected electrode stripe 104 exhibits the same behavior as a solid electrode having the same width, e.g. electrode stripe 106. Therefore, a narrow stripe alone does not produce an enhancement of the signal. Rather, what is necessary is that the narrow stripe be read out against adjacent electrodes which are held at a fixed potential, as is the case with electrode stripe 108.

Graph 120 of FIG. 9 shows the signal strength as a function of position perpendicular to the stripes for a region of the plate that was not exposed to the X-ray flux. The signals for the electrode stripes 102, 104, 106, and 108 are represented by peaks 122, 124, 126, and 128, respectively. A comparison of the four peaks of graph 120 of FIG. 9 and the four peaks of graph 110 of FIG. 8 indicates that the peaks of FIG. 9 are higher. This demonstrates that exposure to X-ray flux diminishes signal strength.

Figure 10:
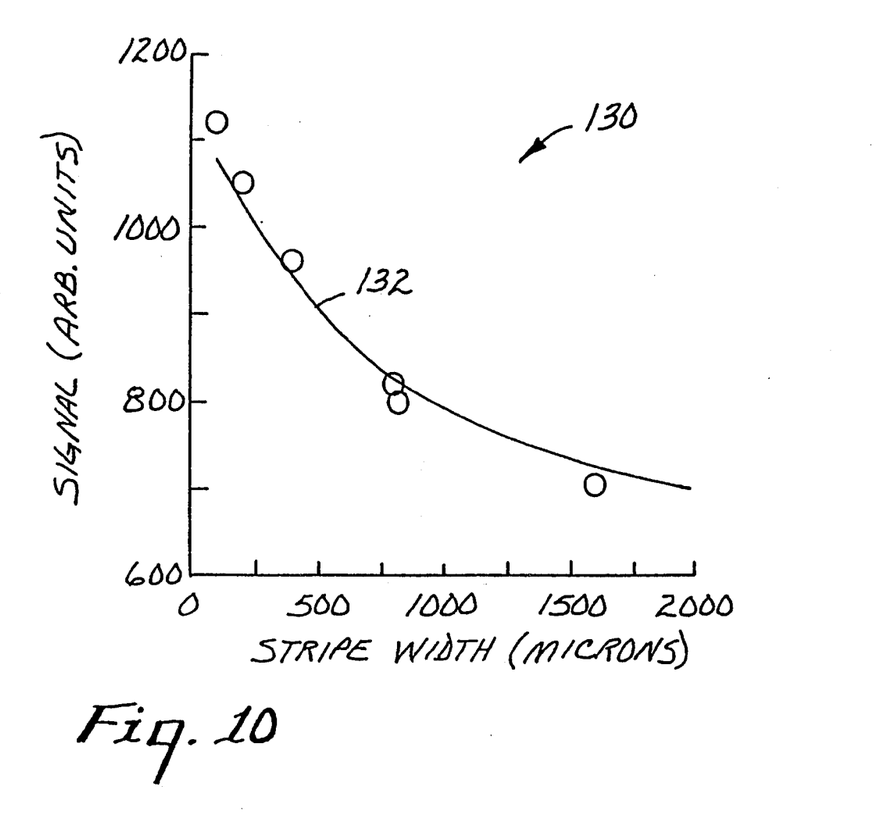
FIG. 10 is a graph showing signal strength as a function of electrode stripe width for a detector in accordance with the invention.

The signal from each stripe reflects the information from the one or more 85-micron pixels defined by the laser spot over that stripe. For intercomparison, therefore, it is necessary to integrate signals such as those shown in FIG. 8, and then normalize these integrated signals to an 85-micron pixel width by multiplying the integrated signal strength by 85/W, where W is the stripe width in microns. The results of this analysis are shown in the graph 130 in FIG. 10, where the (normalized) signal strength is plotted against the stripe width. The signal strength for the active electrode stripes are represented by circles.

The graph 130 shows that signal strength increases by almost a factor of two as the width of the electrode stripe decreases from 1580 to 80 microns. Within the data accuracies of this experiment, the enhancement is in agreement with our calculations for a detector having these dimensions (shown as line 132 in FIG. 10).

We claim:

1. A system for producing an image created by radiation incident upon an imaging device, comprising:
   (a) an imaging device comprising a first conductive layer, an insulative material, a photoconductive insulative layer, an electrically blocking layer, and a second conductive layer which consists essentially of a segmented array of at least one group of elongated, striped, conductive electrodes lying in a first direction;
   (b) means for creating an electric field between the first and second conductive layers such that first charge carriers are created in the imaging device by first incident radiation, and subsequently separated to create a first current, resulting in the formation of a latent electrostatic image near the interface between the insulative material and the photoconductive insulative layers;
   (c) means for reducing the electric field after formation of the latent image to a strength suitable for maintaining the latent image in the photoconductive insulative layer;
   (d) a scanner which, in a first time-ordered pattern, utilizes a second incident radiation to initiate a second current, comprising second charge carriers, within the imaging device; and
   (e) detection electronics connected to, and sensitive to motion of the second charge carriers in, each electrode;

in which:
   (f) the scanner scans the array in a second direction substantially different from the first direction;
   (g) each conductive electrode is addressed in a second, time-ordered pattern such that only one electrode in a group is monitored for motion of the charge carriers at one time, while adjacent electrodes in that group are held at a voltage level representing a virtual ground as measured relative to the monitored electrode, and the detection electronics interprets a coincidence of the first and second patterns as a pixel of the image created by the radiation, which pixel represents a corresponding portion of the latent image.

2. A method for creating and maintaining a latent image of an object in an imaging device, comprising the steps of:
   applying an exposure voltage to the imaging device to create an electric field within a photoconductive insulative layer in the imaging device suitable for creating the latent image;
   exposing the object to radiation to a provide an imagewise pattern of radiation to the photoconductive insulative layer to create the latent image as a pattern of electrostatic charges in the photoconductive insulative layer corresponding to the object; and
   reducing the exposure voltage applied to the imaging device to a maintenance voltage to reduce the electric field to a value suitable for maintaining the latent image in the photoconductive insulative layer.

3. The method of claim 2 wherein the radiation comprises x-ray radiation.

4. The method of claim 2 wherein the electric field created by the exposure voltage has a value within a range of between approximately 5 volts/micron to 20 volts/micron.

5. The method of claim 2 wherein the electric field created by the maintenance voltage has a value within a range of between approximately 1 volt/micron to 5 volts/micron.

6. The method of claim 2 in which the photoconductive insulative layer is constructed of a material selected from the list of materials consisting of selenium, cadmium sulfide, silicon, lead oxide, cadmium telluride, and organic photoconductive materials.

7. The method of claim 2 wherein the imaging device further comprises a first conductive layer, an insulative material, and an electrically blocking layer, and a second conductive layer which consists essentially of a segmented array of at least one group of elongated, striped, conductive electrodes lying in a first direction, wherein the electric field is between the first and second conductive layers such that first charge carriers are created in the imaging device by first incident radiation, and subsequently separated to create a first current, resulting in the formation of a latent electrostatic image near the interface between the insulative material and the photoconductive insulative layer.

8. A method for creating and maintaining a latent image of an object in an imaging device and convening the latent image into electronic signals, comprising the steps of:
applying an exposure voltage to the imaging device to create an electric field within a photoconductive insulative layer in the imaging device suitable for creating the latent image;
exposing the object to radiation to a provide an imagewise pattern of radiation to the photoconductive insulative layer to create the latent image as a pattern of electrostatic charges in the photoconductive insulative layer corresponding to the object;
reducing the exposure voltage applied to the imaging device to a maintenance voltage to reduce the electric field to a value suitable for maintaining the latent image in the photoconductive insulative layer; and
scanning the photoconductive insulative layer with a scanning radiation to convert the latent image into electronic signals which represent the latent image.

9. The method of claim 8 wherein the scanning radiation within the scanning step is applied by at least one point source.

10. The method of claim 8 further comprising the step of changing the maintenance voltage prior to the scanning step to a scanning voltage to change the electric field to a value suitable for converting the latent image to the electronic signals.

11. The method of claim 10 wherein the electric field created by the scanning voltage has a value within a range of between approximately 1 volt/micron to 5 volts/micron.

12. An apparatus for creating and maintaining a latent image of an object in an imaging device, comprising:
means for applying an exposure voltage to the imaging device to create an electric field within a photoconductive insulative layer in the imaging device suitable for creating the latent image;
means for exposing the object to radiation to a provide an imagewise pattern of radiation to the photoconductive insulative layer to create the latent image as a pattern of electrostatic charges in the photoconductive insulative layer corresponding to the object; and
means for reducing the exposure voltage applied to the imaging device to a maintenance voltage to reduce the electric field to a value suitable for maintaining the latent image in the photoconductive insulative layer.

13. The apparatus of claim 12 wherein the radiation comprises x-ray radiation.

14. The apparatus of claim 12 wherein the electric field created by the exposure voltage has a value within a range of between approximately 5 volts/micron to 20 volts/micron.

15. The apparatus of claim 12 wherein the electric field created by the maintenance voltage has a value within a range of between approximately 1 volt/micron to 5 volts/micron.

16. The apparatus of claim 12 in which the photoconductive insulative layer is constructed of a material selected from the list of materials consisting of selenium, cadmium sulfide, silicon, lead oxide, cadmium telluride, and organic photoconductive materials.

17. The apparatus of claim 12 wherein the imaging device further comprises a first conductive layer, an insulative material, an electrically blocking layer, and a second conductive layer which consists essentially of a segmented array of at least one group of elongated, striped, conductive electrodes lying in a first direction, wherein the electric field is between the first and second conductive layers such that first charge carriers are created in the imaging device by first incident radiation, and subsequently separated to create a first current, resulting in the formation of a latent electrostatic image near the interface between the insulative material and the photoconductive insulative layer.

18. An apparatus for creating and maintaining a latent image of an object in an imaging device and converting the latent image into electronic signals, comprising:
power supply means for applying an exposure voltage to the imaging device to create an electric field within a photoconductive insulative layer in the imaging device suitable for creating the latent image;
means for exposing the object to radiation to a provide an imagewise pattern of radiation to the photoconductive insulative layer to create the latent image as a pattern of electrostatic charges in the photoconductive insulative layer corresponding to the object;
means for reducing the exposure voltage applied to the imaging device to a maintenance voltage to reduce the electric field to a value suitable for maintaining the latent image in the photoconductive insulative layer; and
means for scanning the photoconductive insulative layer with a scanning radiation to convert the latent image to electronic signals representing the latent image.

19. The apparatus of claim 18 further comprising means for changing the maintenance voltage prior to scanning to a scanning voltage to change the electric field to a value suitable for converting the latent image to the electronic signals.

20. The apparatus of claim 19 wherein the electric field created by the scanning voltage has a value within a range of between approximately 1 volt/micron to 5 volts/micron.

* * * * *

UNITED STATES PATENT AND TRADEMARK OFFICE
CERTIFICATE OF CORRECTION

PATENT NO.  : 5,354,982
DATED       : Oct. 11, 1994
INVENTOR(S) : Owen L. Nelson and John E. Potts It is certified that error appears in the above-indentified patent and that said Letters Patent is hereby corrected as shown below:

Column 15, line 4, delete "convening"
and insert --converting--.

Signed and Sealed this

Fourth Day of April, 1995

Attest:

BRUCE LEHMAN

Attesting Officer        Commissioner of Patents and Trademarks